(12) United States Patent
Yamada et al.

(10) Patent No.: US 8,420,303 B2
(45) Date of Patent: Apr. 16, 2013

(54) SUBSTRATE PROCESSING METHOD, COMPUTER-READABLE STORAGE MEDIUM AND SUBSTRATE PROCESSING SYSTEM

(75) Inventors: Yoshiaki Yamada, Tokyo (JP); Keiichi Tanaka, Koshi (JP); Hitoshi Kosugi, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 153 days.

(21) Appl. No.: 12/957,442

(22) Filed: Dec. 1, 2010

(65) Prior Publication Data

US 2011/0143289 A1    Jun. 16, 2011

(30) Foreign Application Priority Data

Dec. 10, 2009 (JP) ................................. 2009-280048

(51) Int. Cl.
*G03F 7/26* (2006.01)
(52) U.S. Cl.
USPC ............................. 430/330; 430/322; 430/325
(58) Field of Classification Search .................. 430/322, 430/325, 330
See application file for complete search history.

(56) References Cited

U.S. PATENT DOCUMENTS 7,767,385 B2 * 8/2010 Larson et al. ................. 430/322
2009/0035708 A1 * 2/2009 Furukawa et al. ............ 430/327

FOREIGN PATENT DOCUMENTS

| JP | 2005-221801 A | 8/2005 |
| JP | 2006-78744 A | 3/2006 |
| JP | 2008-187126 A | 8/2008 |

OTHER PUBLICATIONS

Japanese Office Action cited in Japanese Application No. 2009-280048, dated Jan. 6, 2012, three (3) pages, English Office Action summary, two (2) pages.

* cited by examiner

*Primary Examiner* — Kathleen Duda
(74) *Attorney, Agent, or Firm* — Nath, Goldberg & Meyer; Jerald L. Meyer (57) ABSTRACT

A PEB unit has a first heat plate and a second heat plate. After an exposure process for a resist film for EUV on a wafer and before a development process, the PEB unit heats the wafer through the first heat plate at a first heating temperature. A heating time through the first heat plate is not less than 10 seconds and not more than 30 seconds. Thereafter, the PEB unit heats the wafer through the second heat plate at a second heating temperature lower than the first heating temperature. A temperature difference between the first heating temperature and the second heating temperature is not less than 20° C. and not more than 60° C.

3 Claims, 7 Drawing Sheets

SUBSTRATE PROCESSING METHOD, COMPUTER-READABLE STORAGE MEDIUM AND SUBSTRATE PROCESSING SYSTEM

CROSS-REFERENCE TO RELATED APPLICATIONS

This application is based upon and claims the benefit of priority from Japanese Patent Application No. 2009-280048, filed on Dec. 10, 2009, the entire contents of which is incorporated herein by reference.

TECHNICAL FIELD

The present disclosure relates to a substrate processing method for performing a photolithography process on a substrate to form a predetermined resist pattern in a resist film for EUV on the substrate. The present disclosure further relates to a computer storage medium and a substrate processing system.

BACKGROUND

In a photolithography process in the manufacture of semiconductor devices, predetermined resist patterns are formed on a semiconductor wafer (hereinafter, referred to as a wafer) by sequentially performing the following processes: a resist coating process for applying a resist liquid on the wafer to form a resist film; an exposure process for exposing a predetermined pattern in the resist film; a post exposure baking process (hereinafter, referred to as a PEB process) for heating the wafer in order to promote a chemical reaction in the resist film after the exposure process; and a developing process for developing the exposed resist film.

In recent years, a chemically amplified resist has been widely used in the aforementioned formation of resist patterns. The chemically amplified resist produces acid when exposed. Such acid is diffused through the PEB process and progresses to a chemical reaction in the resist, thereby changing the solubility of an exposed region to a developing liquid.

Further, in the aforementioned exposure process, a light source, which outputs a KrF laser (wavelength: 248 nm), a ArF laser (wavelength: 193 nm), a F2 laser (wavelength: 157 nm) or the like, is used as an exposure light source. The exposure process is performed by irradiating this laser to the resist film on the wafer. In this case, in the PEB process to be performed after the exposure process, the wafer is heated at a heating temperature of, for example, 110° C. or 90° C. for sixty seconds (for example, see Japanese Laid-Open Patent Application No. 2005-221801).

Meanwhile, to achieve still higher integration of semiconductor devices, a resist pattern to be formed on a wafer has become more and more minute. For this reason, it has been considered to use a light source which outputs a light having a wavelength shorter than the KrF laser, the ArF laser and the F2 laser (for example, an EUV (Extreme Ultra Violet) having a wavelength of 13 nm to 14 nm) as the exposure light source of the aforementioned exposure process.

However, a light amount of an EUV light source, which is used in a so-called EUV lithography performing an exposure process by means of an EUV, is significantly low in comparison with conventional exposure light sources. Thus, when performing the PEB process by the above-explained conventional methods, the acid produced from the resist for EUV is not easily diffused and therefore the chemical reaction in the resist does not easily progress. Accordingly, forming a resist pattern in a resist film for EUV on a substrate using the conventional methods leads to reduction in the throughput of a wafer process.

SUMMARY

According to one aspect of the present disclosure, there are provided embodiments of a method of processing a substrate for performing a photolithography process on a substrate to form a predetermined resist pattern in a resist film for EUV on the substrate. In one exemplary embodiment, a heating process is performed after an exposure process for the resist film for EUV on the substrate and before a development process. The heating process includes a first heating process for heating the substrate at a first heating temperature and a second heating process for heating the substrate at a second heating temperature lower than the first heating temperature and higher than a temperature of a process atmosphere.

In one embodiment, a temperature difference between the first heating temperature and the second heating temperature may be not less than 20° C. and not more than 60° C.

In another embodiment, a heating time for the substrate in the first heating process may be not less than 10 seconds and not more than 30 seconds.

According to a further aspect of the present disclosure, there is provided a computer-readable storage medium storing a program running on a computer of a control device for controlling a substrate processing system in order to carry out the foregoing substrate processing method through the substrate processing system.

According to another aspect of the present disclosure, there are provided embodiments of a system of processing a substrate for performing a photolithography process on a substrate to form a predetermined resist pattern in a resist film for EUV on the substrate. In one exemplary embodiment, the system includes a heating unit and a control part. The heating unit includes a first heating plate for placing the substrate thereon and heating the substrate at a first heating temperature and a second heating plate for placing the substrate thereon and heating the substrate at a second heating temperature lower than the first heating temperature and higher than a temperature of a process atmosphere. The control part controls the heating unit such that the heating unit heats the substrate on the second heating plate at the second heating temperature after heating the substrate on the first heating plate at the first heating temperature when performing a heating process for the substrate in the heating unit after an exposure process for the resist film for EUV on the substrate and before a development process.

In one embodiment, the first heating plate and the second heating plate may be accommodated in one process container.

In another embodiment, the first heating plate and the second heating plate may be accommodated in different process containers respectively.

In an alternate embodiment, the control part may control the heating unit such that a temperature difference between the first heating temperature and the second heating temperature is not less than 20° C. and not more than 60° C.

In another embodiment, the control part may control the heating unit such that a heating time for the substrate in the first heating plate is not less than 10 seconds and not more than 30 seconds.

DETAILED DESCRIPTION

Figure 1:
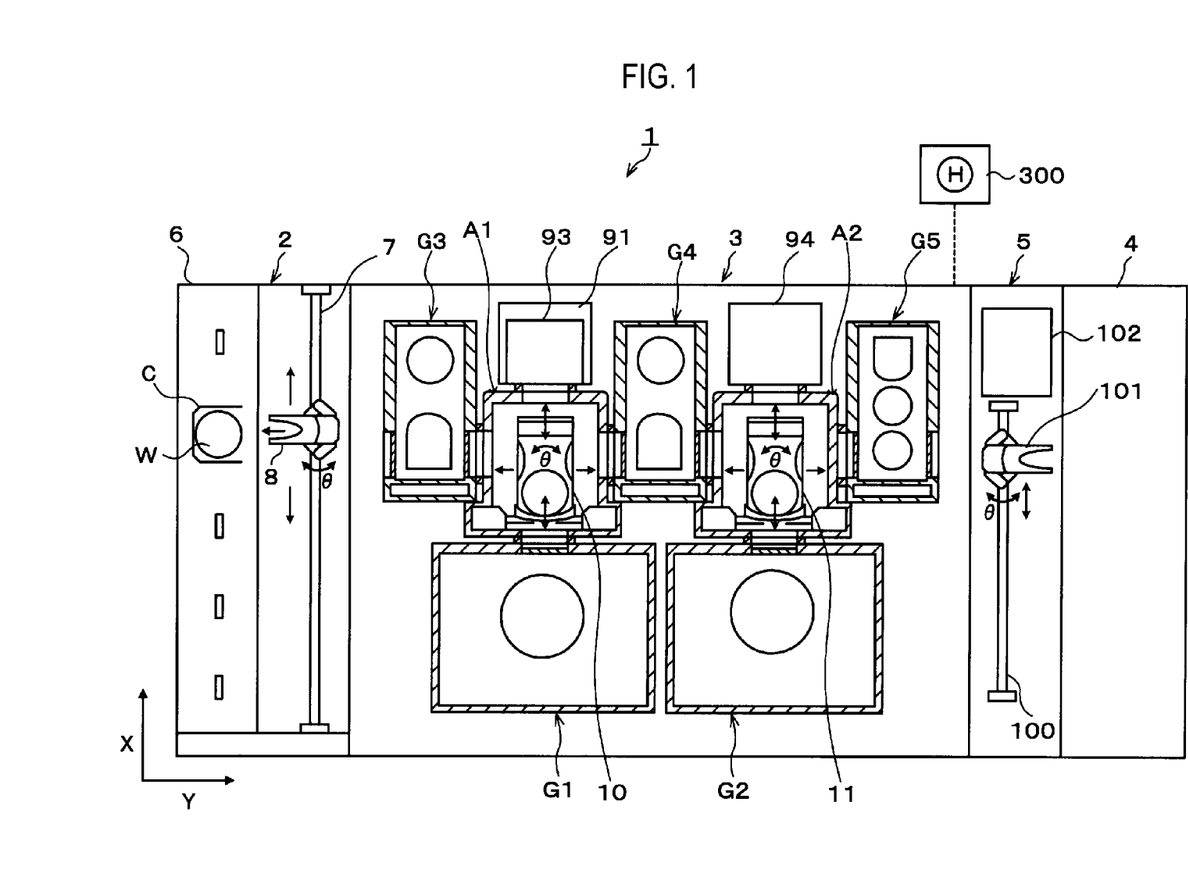
FIG. 1 is a plan view showing a schematic configuration of a coating and developing system according to one embodiment.
Figure 2:
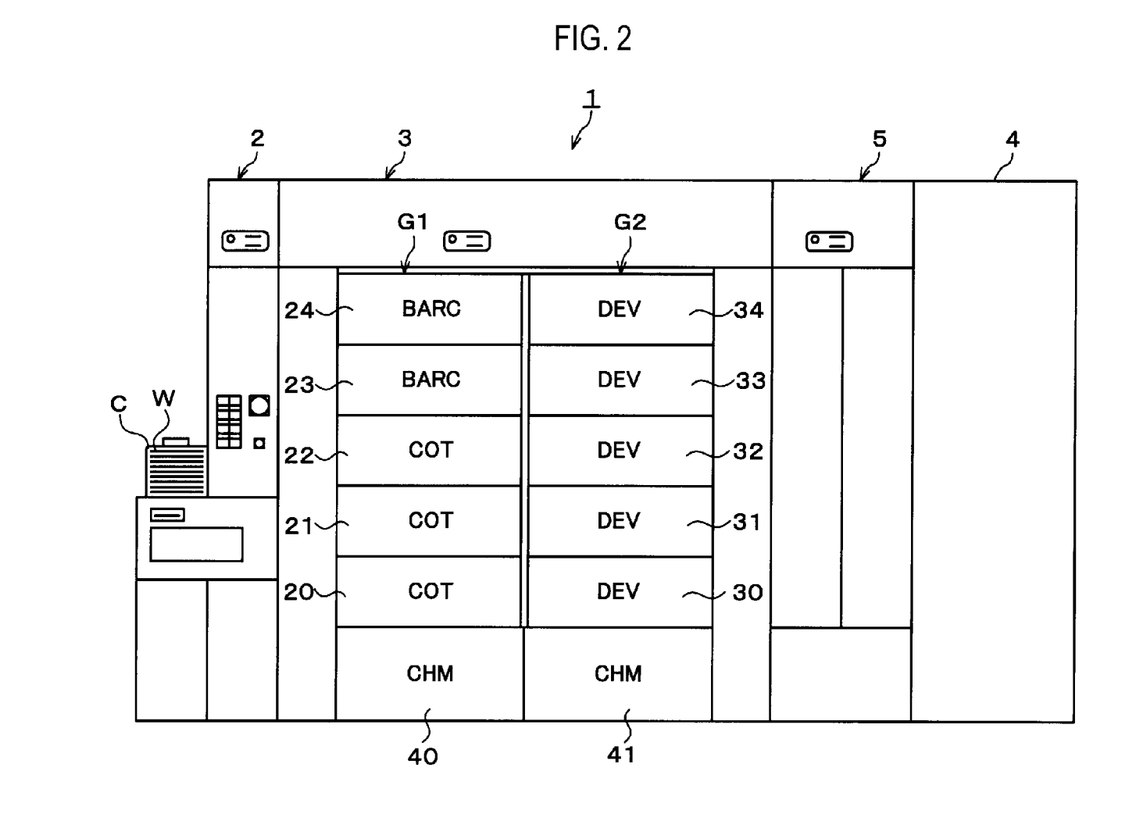
FIG. 2 is a front view of the coating and developing system according to one embodiment.
Figure 3:
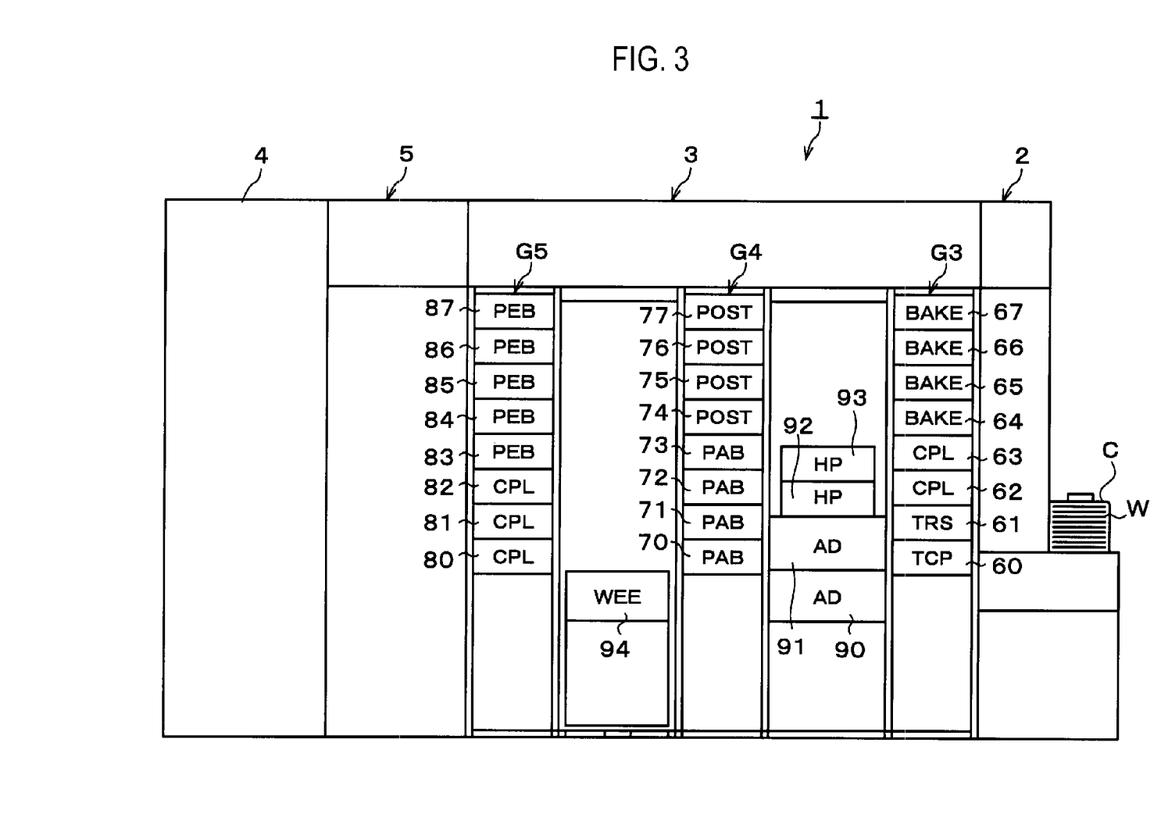
FIG. 3 is a rear view of the coating and developing system according to one embodiment.

Embodiments will now be described in detail with reference to the accompanying drawings. FIG. 1 is a plan view showing a schematic configuration of a coating and developing system 1 (substrate processing system) according to one embodiment. FIG. 2 is a front view of the coating and developing system 1. FIG. 3 is a rear view of the coating and developing system 1. In this embodiment, the coating and developing system 1 performs a so-called EUV lithography process that performs an exposure process using an EUV.

As shown in FIG. 1, the coating and developing system 1 is configured to integrally connect a cassette station 2, a process station 3 and an interface station 5. The cassette station 2 carries wafers W (for example, twenty five wafers) to and from the coating and developing system 1 per cassette. Further, the cassette station 2 carries the wafer W to and from a cassette C. The process station 3 includes various kinds of processing units, which perform predetermined processes per one wafer during a photolithography process, and which are disposed in multiple stages. The interface station 5 receives and delivers the wafer W between the process station 3 and an exposure apparatus 4 provided near the process station 3. The exposure apparatus 4 has a light source (not shown) for outputting an EUV (wavelength: 13 nm to 14 nm).

The cassette station 2 includes a cassette placing table 6 that is configured to place a plurality of cassettes C in line in an X-direction (in an upward and downward direction in FIG. 1). The cassette station 2 includes a wafer carrier 8 movable on a conveying path 7 along the X-direction. Further, the wafer carrier 8 is movable in a wafer array direction (a Z-direction; a vertical direction) of the wafers W accommodated in the cassette C. Thus, the wafer carrier 8 can selectively access the wafer W in each of the cassettes C arranged in the X-direction.

The wafer carrier 8 is rotatable in a θ direction on a Z-axis and thus can access a temperature regulating unit 60 as well as a transition unit 61 for receiving and delivering the wafer W, which are disposed in a third processing unit group G3 of the process station 3.

The process station 3 adjacent to the cassette station 2 includes, for example, five processing unit groups G1 to G5, in each of which a plurality of the processing units are disposed in multiple stages. A first processing unit group G1 and a second processing unit group G2 are disposed in this order from the cassette station 2 at a negative X-direction side (a lower side in FIG. 1) of the process station 3. A third processing unit group G3, a fourth processing unit group G4 and a fifth processing unit group G5 are disposed in this order from the cassette station 2 at a positive X-direction side (an upper side in FIG. 1) of the process station 3. A first carrying unit A1 is provided between the third processing unit group G3 and the fourth processing unit group G4. A first carrying arm 10 for supporting and carrying the wafer W is provided inside the first carrying unit A1. The first carrying arm 10 can selectively access each processing unit in the first processing unit group G1, the third processing unit group G3 and the fourth processing unit group G4 to carry the wafer W. A second carrying unit A2 is provided between the fourth processing unit group G4 and the fifth processing unit group G4. A second carrying arm 11 for supporting and carrying the wafer W is provided inside the second carrying unit A2. The second carrying arm 11 can selectively access each processing unit in the second processing unit group G2, the fourth processing unit group G4 and the fifth processing unit group G5 to carry the wafer W.

As shown in FIG. 2, liquid treatment units for supplying a predetermined liquid to the wafer W and performing a process for the wafer W (for example, resist coating units 20, 21, 22 for applying a resist liquid for EUV on the wafer W) and bottom coating units 23, 24 for forming an antireflection film for preventing a light reflection during an exposure process are stacked in five stages in the first processing unit group G1 in order from bottom to top. Liquid treatment units (for example, developing units 30 to 34 for applying a developing liquid to the wafer W and performing a development process for the wafer W) are stacked in five stages in the second processing unit group G2 in order from bottom to top. Further, chemical chambers 40, 41 for supplying various kinds of processing liquids to the liquid treatment units in each processing unit group G1, G2 are provided at a lowermost stage of the first processing unit group G1 and the second processing unit group G2, respectively. Further, the resist for EUV is a resist for use in an EUV lithography and is depolymerized when compared to conventional resists such as a resist for KrF, a resist for ArF or a resist for F2.

As shown in FIG. 3, the temperature regulating unit 60, the transition unit 61, high-precision temperature regulating units 62, 63 for regulating a temperature of the wafer W under temperature management with high precision, and high-temperature heating units 64 to 67 for heating the wafer W at a high temperature are stacked in eight stages in the third processing unit group G3 in order from bottom to top.

Pre-baking units 70 to 73 for heating the wafer W subjected to the resist coating process and post-baking units 74 to 77 for heating the wafer W subjected to the development process are stacked in eight stages in the fourth processing unit group G4 in this order from bottom to top.

A plurality of heating units for heating the wafer W, such as high-precision temperature regulating units 80 to 82 and post-exposure baking units 83 to 87 (hereinafter, referred to as PEB units) are stacked in eight stages in the fifth processing unit group G5 in order from bottom to top.

As shown in FIG. 1, a plurality of process units are disposed at the positive X-direction side of the first carrying unit A1. Specifically, as shown in FIG. 3, hydrophobizing units 90, 91 for hydrophobizing the wafer W and heating units 92, 93 for heating the wafer W are stacked in four stages in order from bottom to top. As shown in FIG. 1, an edge exposure unit 94 for selectively exposing only an edge portion of the wafer W is disposed at the positive X-direction side of the second carrying unit A2.

As shown in FIG. 1, the interface station 5 includes a wafer carrier 101 moving on a conveying path 100 extending in the X-direction and a buffer cassette 102. The wafer carrier 101 is not only movable in the Z-direction, but also rotatable in a θ direction and thus can access the exposure apparatus 4 adjacent to the interface station 5, the buffer cassette 102 and the fifth processing unit group G5 to carry the wafer W.

Figure 4:
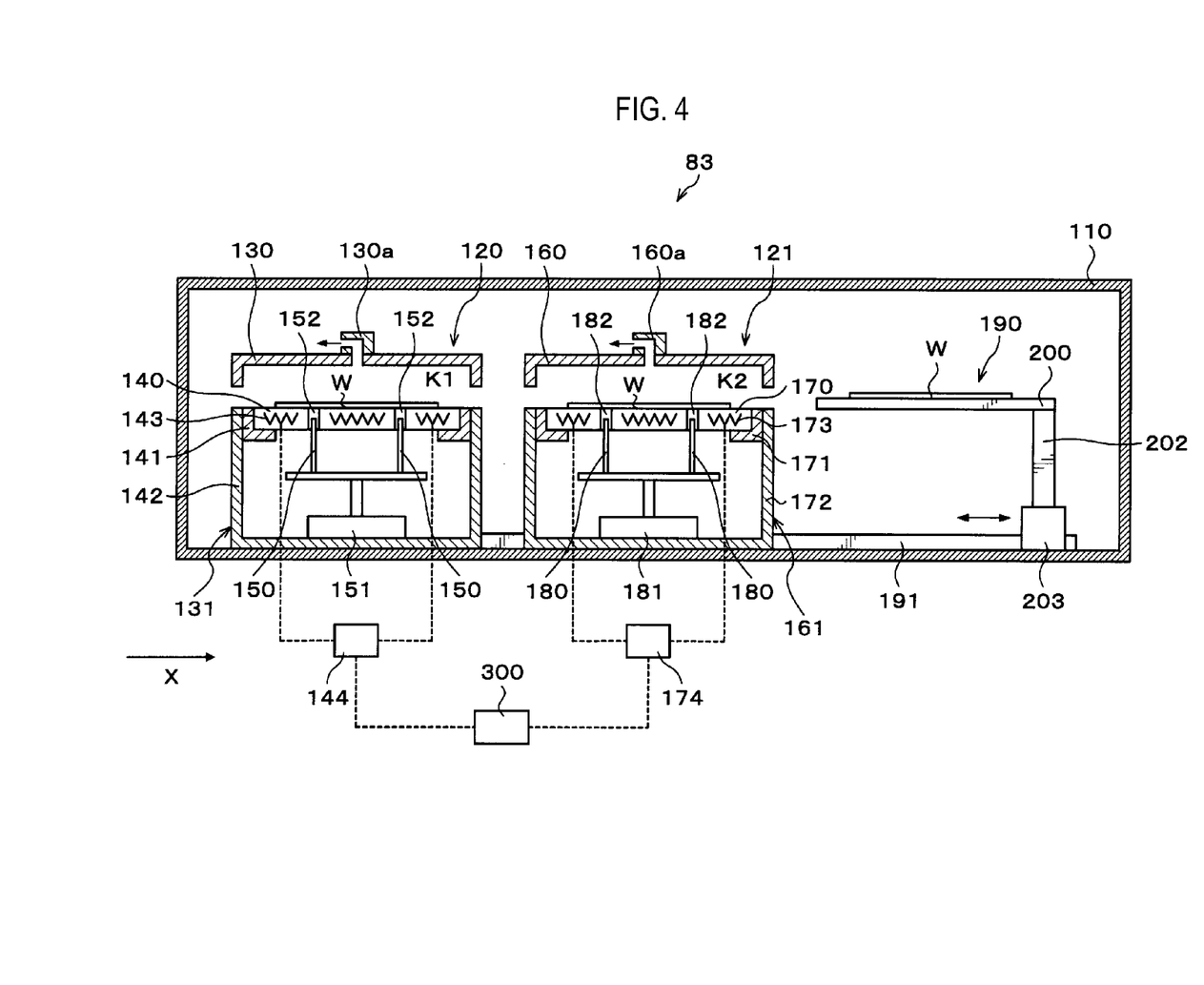
FIG. 4 is a longitudinal sectional view showing a schematic configuration of a PEB unit.
Figure 5:
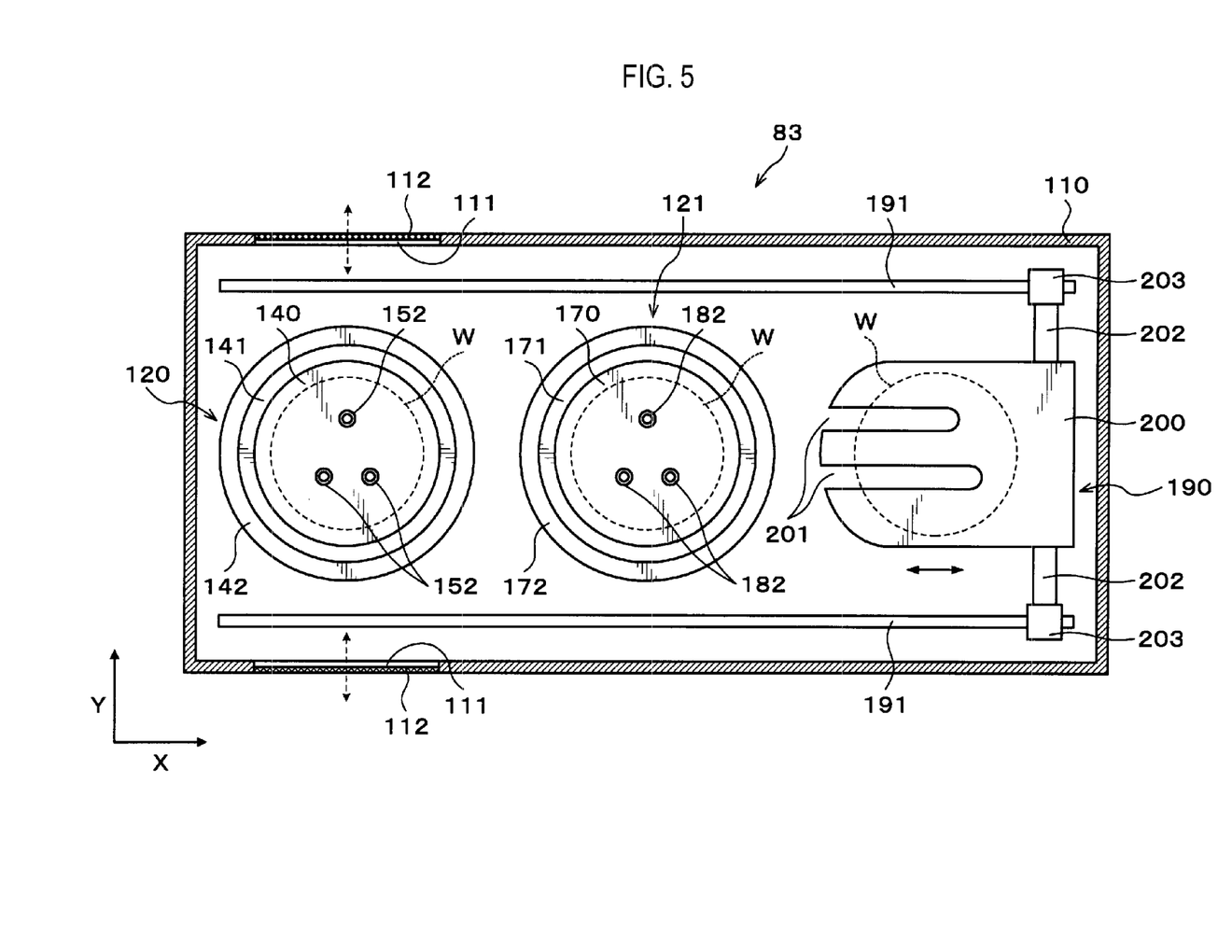
FIG. 5 is a cross sectional view showing a schematic configuration of the PEB unit.

Next, the aforesaid PEB units 83 to 87 will be described. FIG. 4 is a longitudinal sectional view schematically illustrating a configuration of the PEB unit 83, while FIG. 5 is a cross sectional view schematically illustrating the configuration of the PEB unit 83.

As shown in FIG. 4, the PEB unit 83 has a process container 110 configured to seal its inside. As shown in FIG. 5, carrying openings 111 for the wafer W are formed in one side of the processing container 110 facing toward the first carrying unit A1 and one side of the processing container 110 facing toward the wafer carrier 101, respectively. Each carrying opening 111 is provided with an opening and closing shutter 112. Further, inside the process container 110, a first heating part 120 and a second heating part 121 are disposed along the X-direction (a right-and-left direction in FIG. 5). The first heating part 120 is disposed opposite of the carrying opening 111, while the second heating part 121 is disposed at a positive X-direction side of the first heating part 120 (a right side in FIG. 5). Further, a temperature of a process atmosphere in the process container 110 is, for example, 23° C.

As shown in FIG. 4, the first heating part 120 includes a lid 130 upwardly positioned and a heat plate housing portion 131 downwardly positioned. The lid 130 is vertically movable. The heat plate housing portion 131 is integrated with the lid 130 to define a first processing chamber K1.

The lid 130 has a substantially cylindrical shape with its lower side open. An exhaust portion 130a is provided at a central portion of an upper side of the lid 130. An atmosphere in the first processing chamber K1 is uniformly exhausted through the exhaust portion 130a.

The heat plate housing portion 131 includes: a ring-shaped holding member 141 for housing a first heat plate 140 (a first heating plate) and holding an outer periphery of the first heat plate 140; and a support ring 142 having a substantially cylindrical shape and encircling an outer periphery of the holding member 141. The first heat plate 140 has a substantial disk shape with a certain thickness. The first heat plate 140 can place the wafer W thereon and heat the wafer.

The first heat plate 140 contains a heater 143 that is energized to generate heat. A heat generation amount of the heater 143 is controlled by a temperature controller 144. The temperature controller 144 can control the heat generation amount of the heater 143 to regulate a heating temperature of the first heat plate 140 to a first heating temperature (for example, 120° C.). Setting the heating temperature in the temperature controller 144 is performed by a control part 300 that will be described below.

A lifting and lowering pin 150, which supports the wafer W under the wafer to lift and lower the wafer, is provided below the first heat plate 140. The lifting and lowering pin 150 is vertically movable by a lifting and lowering drive mechanism 151. Apertures 152 passing through the first heat plate 140 in a thickness direction thereof are formed near a central portion of the first heat plate 140. The lifting and lowering pin 150 may be lifted below the first heat plate 140 and pass through the aperture 152 to project upwardly from the first heat plate 140.

The second heating part 121 has the same configuration as the first heating part 120. That is, the second heating part 121 includes a lid 160 upwardly positioned and a heat plate housing portion 161 downwardly positioned. The lid 160 is vertically movable. The heat plate housing portion 161 is integrated with the lid 160 to define a second processing chamber K2.

The lid 160 has a substantially cylindrical shape with its lower side open. An exhaust portion 160a is provided at a central portion of an upper side of the lid 160. An atmosphere in the second processing chamber K2 is uniformly exhausted through the exhaust portion 160a.

The heat plate housing portion 161 includes: a ring-shaped holding member 171 for housing a second heat plate 170 (a second heating plate) and holding an outer periphery of the second heat plate 170; and a support ring 172 having a substantially cylindrical shape and encircling an outer periphery of the holding member 171. The second heat plate 170 has a substantial disk shape with a certain thickness. The second heat plate 170 can place the wafer W thereon and heat the wafer.

The second heat plate 170 contains a heater 173 that is energized to generate heat. A heat generation amount of the heater 173 is controlled by a temperature controller 174. The temperature controller 174 can control the heat generation amount of the heater 173 to regulate a heating temperature of the second heat plate 170 to a second heating temperature (for example, 80° C.). Setting the heating temperature in the temperature controller 144 is performed by, for example, the control part 300 that will be described below. The first heating temperature and the second heating temperature are not limited to this embodiment. In another embodiment, the second heating temperature may be lower than the first heating temperature and higher than the temperature of the process atmosphere in the process container 110. Further, a temperature difference between the first heating temperature and the second heating temperature may be not less than 20° C. and not more than 60° C.

A lifting and lowering pin 180, which supports the wafer W under the wafer to lift and lower the wafer, is provided below the second heat plate 170. The lifting and lowering pin 180 is vertically movable by a lifting and lowering drive mechanism 181. Apertures 182 passing through the second heat plate 170 in a thickness direction thereof are formed near a central portion of the second heat plate 170. The lifting and lowering pin 180 may be lifted below the second heat plate 170 and pass through the aperture 182 to project upwardly from the second heat plate 170.

As shown in FIG. 5, a carrying mechanism 190 for carrying the wafer W is provided at a positive X-direction side of the second heating part 121 (at a right side in FIG. 5) in the process container 110. In the process container 110, rails 191 extending in the X-direction (in a right-and-left direction in FIG. 5) are provided at a positive Y-direction side (at an upper side in FIG. 5) and a negative Y-direction side (at a lower side in FIG. 5) of both the first heating part 120 and the second heating part, respectively. The carrying mechanism 190 is movable on the rails 191 and can carry the wafer W between the first heating part 120 and the second heating part 121.

The carrying mechanism 190 has a placing plate 200 for placing the wafer W thereon. The placing plate 200 has a substantially rectangular flat plate shape. An end surface of the placing plate 200 facing toward the second heating part 121 curves in a circular-arc shape. Two slits 201 are formed in the placing plate 200 along the X-direction. The slits 201 extend from the end surface of the placing plate 200 facing toward the second heating part 121 to a vicinity of a central portion of the placing plate 200. The slits 201 can prevent the placing plate 200 from interfering with the lifting and lowering pin 150 of the first heating part 120 and the lifting and lowering pin 180 of the second heating part 121.

As shown in FIG. 4, the placing plate 200 is supported by a supporting arm 202. The supporting arm 202 is coupled to drive parts 203. As the drive parts 203 travel on the rails 191, the placing plate 200 can move between the first heating part 120 and the second heating part 121.

Descriptions on the PEB units 84 to 87 will be omitted since the configurations thereof are the same as the above-described configuration of the PEB unit 83.

The control part 300 is provided in the coating and developing system 1, as shown in FIG. 1. The control part 300 includes, for example, a computer and has a program storage part (not shown). The program storage part stores a program for i) controlling heating temperature settings in the first heat plate 140 and the second heat plate 170, and ii) controlling operations of drive systems in the PEB units 83 to 87 to perform a heating process for the wafer W. In addition to this, the program storage part stores a program for controlling transfer of the wafer W among the cassette station 2, the process station 3, the exposure apparatus 4 and the interface station 5, and operations of drive systems in the process station 3 to perform wafer processes in the coating and developing system 1. Further, those programs may be stored on a computer-readable storage medium H such as a hard disk (HD), a flexible disk (FD), a compact disk (CD), a magnetic optical disk (MO), a memory card, etc. that are readable on a computer. Furthermore, those programs may be installed from such a storage medium H to the control part 300.

The coating and developing system 1 according to this embodiment is configured as described above. Next, examples of wafer processes performed in the coating and developing system 1 will be described below.

First, if the cassette C accommodating a plurality of non-processed wafers W is placed on the cassette placing table 6, the wafers W in the cassette C are removed one at a time by the wafer carrier 8 and carried to the temperature regulating unit 60 of the third processing unit group G3. A temperature of the wafer W carried to the temperature regulating unit 60 is regulated to a predetermined temperature. Thereafter, the wafer W is carried to the bottom coating unit 23 by the first carrying unit A1 and then the antireflection film is formed on the wafer W. The wafer W with the antireflection film formed thereon is sequentially carried to the heating unit 92, the high-precision temperature regulating unit 62 and the hydrophobizing unit 90 by the first carrying unit A1 and a predetermined process is performed in each of the units. Thereafter, the wafer W is carried to the resist coating unit 20 by the first carrying unit A1. The resist coating unit 20 applies a resist liquid for EUV on the wafer W to form a resist film for EUV on the wafer W.

The wafer W with the resist film for EUV formed thereon is carried to the pre-baking unit 70 by the first carrying unit A1 and then is subjected to a pre-bake process. Subsequently, the wafer W is sequentially carried to the edge exposure unit 94 and the high-precision temperature regulating unit 82 by the second carrying unit A2 and a predetermined process is performed in each of the units. Thereafter, the wafer W is carried to the exposure apparatus 4 by the wafer carrier 101 of the interface station 5. The exposure apparatus 4 irradiates an EUV on the resist film for EUV on the wafer W to thereby selectively expose a predetermined pattern in the resist film for EUV.

The wafer W, wherein the exposure process is finished, is carried to the PEB unit 83 by the wafer carrier 101. The wafer W carried to the PEB unit 83 is delivered to the lifting and lowering pin 150 that is lifted in advance and stands by. After the lid 130 is closed, the lifting and lowering pin 150 is lowered down and thus the wafer W is placed on the first heat plate 140. On this occasion, the first heat plate 140 is already heated at the first heating temperature (for example, 120° C.). And, the wafer W is heated on the heated first heat plate 140 for, for example, 20 seconds. Performing heating through the first heat plate 140 as such promotes diffusion of acid produced from the resist film for EUV on the wafer W. A heating time for the wafer W through the first heat plate 140 is not limited to 20 seconds in this embodiment. In another embodiment, the heating time may be not less than 10 seconds and not more than 30 seconds.

Next, after the lid 130 is opened, the lifting and lowering pin 150 is lifted up and, at the same time, the placing plate 200 of the carrying mechanism 190 is moved above the first heat plate 140. Subsequently, the wafer W is delivered from the lifting and lowering pin 150 to the placing plate 200 and the placing plate 200 is then moved over the second heat plate 170.

Thereafter, the wafer W on the placing plate 200 is delivered to the lifted lifting and lowering pin 180. After the placing plate 200 is moved away from the second heat plate 170 and the lid 160 is closed, the lifting and lowering pin 180 is lowered down to place the wafer W on the second heat plate 170. On this occasion, the second heat plate 170 is already heated at the second heating temperature (for example, 80° C.). And, the wafer W is heated on the heated second heat plate 170 for, for example, 40 seconds. Performing heating through the second heat plate 170 as such promotes a chemical reaction in the resist film for EUV, which is caused by the acid (the diffusion of the acid is promoted due to heating in the first heat plate 140). In this case, the temperature difference between the first heating temperature and the second heating temperature may be not less than 20° C. and not more than 60° C., as described above.

Next, after the lid 160 is opened, the lifting and lowering pin 180 is lifted up and at the same time, the placing plate 200 is moved above the second heat plate 170. Subsequently, the wafer W is delivered from the lifting and lowering pin 180 to the placing plate 200 and the placing plate 200 is then moved over the first heating part 120. Then, the wafer W is carried out of the PEB unit 83 and serial PEB processes are finished.

Thereafter, the wafer W is carried to the high-precision temperature regulating unit 81 by the second carrying unit A2 and the temperature thereof is regulated. Thereafter, the wafer W is carried to the developing unit 30 by the second carrying unit A2 and then the resist film for EUV on the wafer W is developed. The wafer W is carried to the post-baking unit 74 by the second carrying unit A2 and a post-baking process is then performed. Thereafter, the wafer W is carried to the high-precision temperature regulating unit 63 by the first carrying unit A1 and the temperature thereof is then regulated. Subsequently, the wafer W is carried to the transition unit 61 by the first carrying unit A1 and then returns to the cassette C by the wafer carrier 8. Consequently, serial photolithography processes are finished.

According to the above-described embodiment, the PEB process for the wafer W in the PEB unit 83 can enhance a resist sensitivity of the resist film for EUV on the wafer W. That is, first, the PEB unit 83 heats the wafer W at the first heating temperature (for example, 120° C.) through the first heat plate 140, thereby promoting the diffusion of the acid produced from the resist film for EUV. Then, the second heat plate 170 heats the wafer W at the second heating temperature lower than the first heating temperature (for example, 80° C.). Thus, in a diffusion region of the acid diffused through the process of heating the wafer W at the first heating temperature, the chemical reaction in the resist film for EUV is promoted by such diffusion-promoted acid. Accordingly, the throughput of a wafer process can be improved as to forming a resist pattern in a resist film for EUV on a wafer W.

Further, according to the above-described embodiment, since the first heat plate 140 and the second heat plate 170 are provided in the process container 110 of the PEB unit 83, the wafer W can be carried between the first heat plate 140 and the second heat plate 170 in a very short time. Thus, even if the wafer W is heated in two steps at both the first heating temperature and the second heating temperature as disclosed in this embodiment, the throughput of the wafer process does not decrease. Besides, since the first heat plate 140 and the second heat plate 170 are provided in one process container 110, a footprint of the coating and developing system 1 does not increase.

Further, according to the above-described embodiment, the temperature difference between the first heating temperature and the second heating temperature is set to not less than 20° C. and not more than 60° C., thereby further enhancing the resist sensitivity of the resist film for EUV and preventing deterioration in an LWR (Line Width Roughness) of the resist pattern formed in the resist film for EUV. Further, a reduction of the LWR can be effectively achieved by optimizing the second heating temperature and the second heating time.

Figure 6:
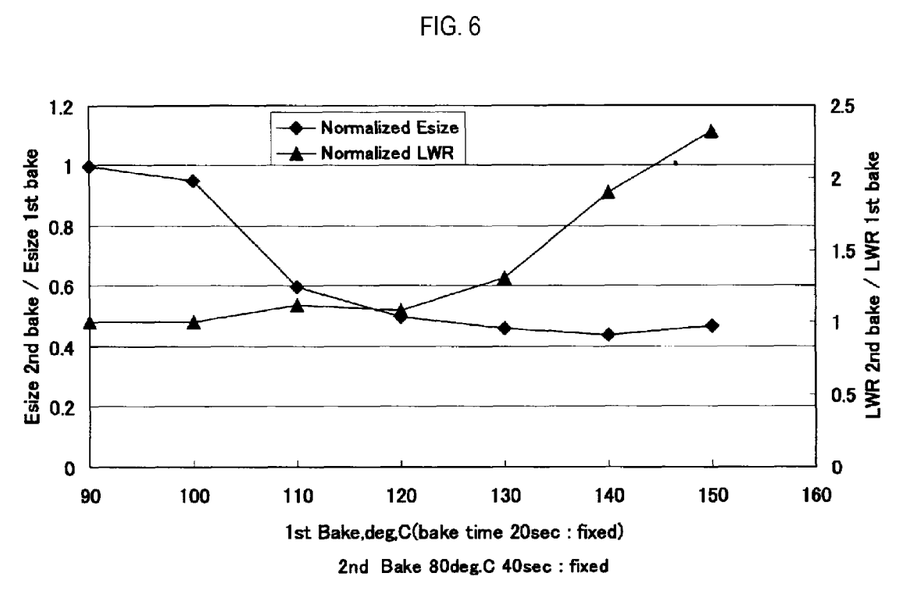
FIG. 6 is a graph showing a relationship between a first heating temperature and a resist sensitivity of a resist film for EUV and a LWR of a resist pattern.

Explanation will be provided below on effects associated with enhancing the resist sensitivity of the resist film for EUV and preventing the deterioration in the LWR of the resist pattern by setting the temperature difference between the first heating temperature and the second heating temperature to not less than 20° C. and not more than 60° C. The inventors conducted verification of the aforesaid effects by measuring the resist sensitivity (Esize) of the resist film for EUV and the LWR of the resist pattern while fixing the second heating temperature to 80° C. and varying the first heating temperature within 90° C. to 150° C. FIG. 6 shows the results of such verification. A horizontal axis in FIG. 6 indicates the first heating temperature and vertical axes in FIG. 6 indicate the resist sensitivity of the resist film for EUV and the LWR of the resist pattern respectively. As for the resist sensitivity of the resist film for EUV, FIG. 6 shows a ratio of the resist sensitivity after heating the wafer W at the first heating temperature to the resist sensitivity after heating the wafer W at the second heating temperature (hereinafter, referred to as a normalized resist sensitivity). Further, as for the LWR of the resist pattern, FIG. 6 shows a ratio of the LWR after heating the wafer W at the first heating temperature to the LWR after heating the wafer W at the second heating temperature (hereinafter, referred to as a normalized LWR).

Referring to FIG. 6, it can be seen, in a range where the temperature difference between the first heating temperature and the second heating temperature is equal to or more than 20° C., that is, where the first heating temperature is equal to or more than 100° C., that the normalized resist sensitivity becomes smaller than one (1) and thus the resist sensitivity is enhanced. Further, it can be seen, in a range where the temperature difference between the first heating temperature and the second heating temperature is greater than 60° C., that is, where the first heating temperature is greater than 140° C., that the normalized LWR becomes approximately equal to or more than two (2) and thus the LWR deteriorates. Accordingly, it can be understood that a range of not less than 20° C. and not more than 60° C. is suitable for the range of the temperature difference between the first heating temperature and the second heating temperature.

Further, according to the above-described embodiment, the heating time for the wafer W through the first heat plate 140 is not less than 10 seconds and not more than 30 seconds, thereby further enhancing the resist sensitivity of the resist film for EUV and further preventing the deterioration of the LWR of the resist pattern formed in the resist film for EUV.

Figure 7:
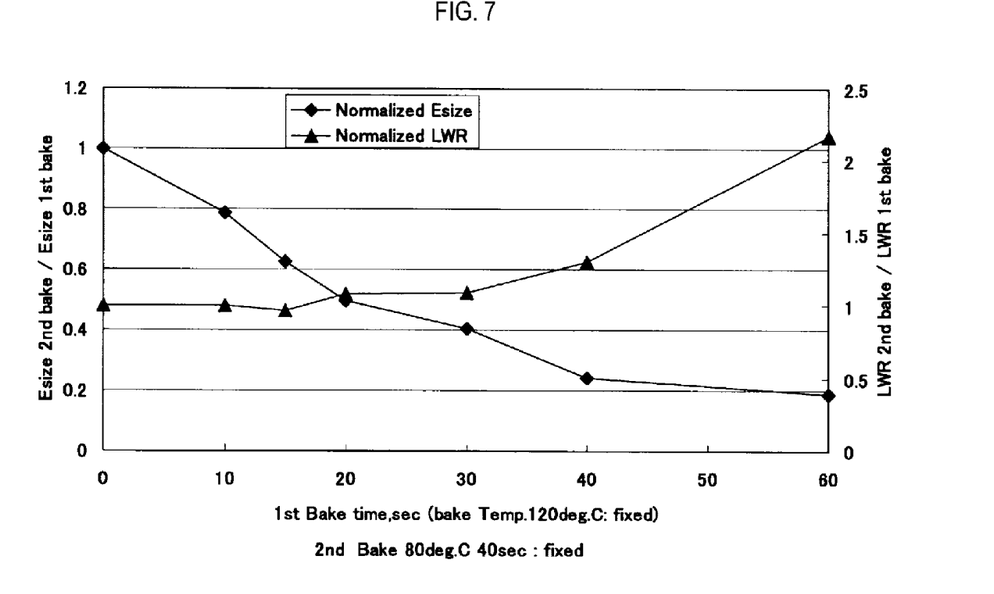
FIG. 7 is a graph showing a relationship between a heating time through a first heat plate and a resist sensitivity of a resist film for EUV and a LWR of a resist pattern.

In this regard, explanation will be provided below on effects associated with enhancing the resist sensitivity of the resist film for EUV and preventing the deterioration in the LWR of the resist pattern by setting the heating time through the first heat plate 140 to not less than 10 seconds and not more than 30 seconds. The inventors conducted verification of the aforesaid effects by measuring the resist sensitivity of the resist film for EUV and the LWR of the resist pattern while varying the heating time through the first heat plate 140 from zero second to 60 seconds. FIG. 7 shows the results of such verification. A horizontal axis in FIG. 7 indicates the heating time through the first heat plate 140, while the vertical axes in FIG. 7 indicate the resist sensitivity of the resist film for EUV and the LWR of the resist pattern respectively. Similar to FIG. 6, FIG. 7 shows the normalized resist sensitivity and the normalized LWR as for the resist sensitivity and the LWR.

Referring to FIG. 7, it can be seen that the normalized resist sensitivity becomes smaller than one (1) and thus the resist sensitivity is enhanced in a range where the heating time through the first heat plate 140 is equal to or more than 10 seconds. Further, it can be seen that the normalized LWR becomes approximately equal to or more than one (1) and thus the LWR deteriorates in a range where the heating time through the first heat plate 140 is greater than 30 seconds. Accordingly, it can be understood that a range of not less than 10 seconds and not more than 30 seconds is suitable for the range of the heating time through the first heat plate 140.

Further, the inventors sought a more preferable range for the heating time of the wafer W through the second heat plate 170. Varying the heating time related thereto, however, had no influence on the resist sensitivity of the resist film for EUV. Accordingly, the heating time through the second heat plate 170 may be optionally set.

In the above-described embodiment, both the first heat plate 140 and the second heat plate 170 are accommodated in one process container 110 in the PEB unit 83. In another embodiment, the first and second heat plates may be accommodated in different process containers, respectively. That is, in the PEB unit 83 shown in FIGS. 4 and 5, any one of the first heating part 120 and the second heating part 121 may be omitted. In such a case, a detailed configuration of the PEB unit according to such an embodiment is the same as that shown in FIGS. 4 and 5 and thus descriptions thereof will be omitted.

In this embodiment, the wafer W can also be heated at the first heating temperature and the second heating temperature in the PEB process that is performed after the exposure process and before the development process. Thus, the resist sensitivity of the resist film for EUV on the wafer W can be enhanced.

Further, in this embodiment, the PEB unit having, for example, the second heat plate 170 may be with a heating process other than the PEB process. In such a case, the number of heating units in the coating and developing system 1 can be reduced. Thus, the footprint of the coating and developing system 1 becomes smaller and a manufacturing cost can be reduced accordingly.

While the embodiments of the present disclosure are described with reference to the accompanying drawings, the present disclosure should not be limited to the foregoing embodiments. It is apparent to those skilled in the art that various variations and modifications may be made without departing from the subject matter of the following claims. Such variations and modifications are intended to fall within the scope of the present disclosure. The present disclosure is not limited to the foregoing embodiments but seeks various aspects. The present disclosure may be applied to any substrates other than a wafer such as a FPD (Flat Panel Display), a mask reticule for a photo mask, etc.

The present disclosure is useful in performing a photolithography process on a substrate such as a semiconductor wafer to form a predetermined resist pattern in a resist film for EUV on the substrate.

What is claimed is:

1. A method of processing a substrate for performing a photolithography process on a substrate to form a predetermined resist pattern in a resist film for EUV on the substrate,
    wherein a heating process performed after an exposure process for the resist film for EUV on the substrate and before a development process comprises:
        a first heating process for heating the substrate at a first heating temperature; and
        a second heating process for heating the substrate at a second heating temperature lower than the first heating temperature and higher than a temperature of a process atmosphere and
    wherein a temperature difference between the first heating temperature and the second heating temperature is not less than 20° C. and not more than 60° C.

2. The method of claim 1, wherein a heating time for the substrate in the first heating process is not less than 10 seconds and not more than 30 seconds.

3. A method of processing a substrate for performing a photolithography process on a substrate to form a predetermined resist pattern in a resist film for EUV on the substrate,
    wherein a heating process performed after an exposure process for the resist film for EUV on the substrate and before a development process comprises:
        a first heating process for heating the substrate at a first heating temperature; and
        a second heating process for heating the substrate at a second heating temperature lower than the first heating temperature and higher than a temperature of a process atmosphere and
    wherein a heating time for the substrate in the first heating process is not less than 10 seconds and not more than 30 seconds.

* * * * *